(12) United States Patent
Ference et al.

(10) Patent No.: US 6,221,775 B1
(45) Date of Patent: *Apr. 24, 2001

(54) COMBINED CHEMICAL MECHANICAL POLISHING AND REACTIVE ION ETCHING PROCESS

(75) Inventors: Thomas G. Ference, Essex Junction, VT (US); William F. Landers, Wappingers Falls; Michael J. MacDonald, Yorktown Heights, both of NY (US); Walter E. Mlynko, Essex Junction, VT (US); Mark P. Murray, Essex Junction, VT (US); Kirk D. Peterson, Essex Junction, VT (US)

(73) Assignee: International Business Machines Corp., Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/159,699

(22) Filed: Sep. 24, 1998

(51) Int. Cl.[7] .................................................. H01L 21/302
(52) U.S. Cl. .......................... 438/691; 438/692; 438/704; 438/712; 438/720
(58) Field of Search .................................. 438/691, 692, 438/704, 706, 712, 720

(56) References Cited

U.S. PATENT DOCUMENTS

| | | |
|---|---|---|
| 4,836,885 | 6/1989 | Breiten et al. . |
| 4,936,950 | 6/1990 | Doan et al. . |
| 4,992,135 | 2/1991 | Doan . |
| 5,173,439 | 12/1992 | Dash et al. . |
| 5,244,534 | 9/1993 | Yu et al. . |
| 5,585,673 * | 12/1996 | Joshi et al. .......................... 257/751 |
| 5,604,158 | 2/1997 | Cadien et al. . |
| 5,627,094 * | 5/1997 | Chan et al. .......................... 438/253 |
| 5,670,019 | 9/1997 | Huang . |
| 5,676,587 | 10/1997 | Landers et al. . |
| 5,769,691 * | 6/1998 | Fruitman ............................ 451/36 |
| 5,792,688 * | 8/1998 | Tseng ................................. 438/253 |
| 5,854,126 * | 12/1998 | Tobben et al. ...................... 438/626 |
| 5,874,345 * | 2/1999 | Coronel et al. ..................... 438/427 |
| 5,889,328 * | 3/1999 | Joshi et al. .......................... 257/751 |
| 5,895,239 * | 4/1999 | Jeng et al. .......................... 438/239 |
| 5,932,487 * | 8/1999 | Lou et al. ........................... 438/692 |
| 5,950,102 * | 9/1999 | Lee ...................................... 438/619 |

* cited by examiner

*Primary Examiner*—Benjamin L. Utech
*Assistant Examiner*—Matthew Anderson
(74) *Attorney, Agent, or Firm*—Ratner & Prestia; Howard J. Walter, Jr., Esq.

(57) ABSTRACT

A process of planarizing the surface of a semiconductor substrate. The process begins by forming patterned raised and recessed regions on the surface of the semiconductor substrate. A layer of material then is formed over the patterned raised and recessed regions. The layer is subjected to a chemical mechanical planarizing (CMP) process step until all of the raised regions are at least partially removed from the layer. Finally, the surface of the polished substrate is etched with a reactive ion etching (RIE) process.

26 Claims, 6 Drawing Sheets

COMBINED CHEMICAL MECHANICAL POLISHING AND REACTIVE ION ETCHING PROCESS

TECHNICAL FIELD

The present invention relates generally to the planarization of integrated circuit surfaces and, more particularly, to a process combining chemical mechanical planarizing and reactive ion etching steps which reduces inadvertent generation of surface defects in underlying layers during planarization.

BACKGROUND OF THE INVENTION

Integrated circuits are formed on a semiconductor substrate, such as silicon, silicon-germainium or gallium arsenide, by patterning films of various materials on the substrate. These patterns of films may be made of conductors or insulators such that complex electrical circuits are formed. Also, the films and the patterns in the films may be of different materials, which is essential for transistor and diode fabrication. During the processing of one substrate, millions of individual devices, which could constitute hundreds of individual "chips," may be formed.

In order for each of the chips to function properly, it is essential that the desired pattern of the circuit design be properly replicated onto the substrate film. If there is a failure in the processing such that the pattern is not properly applied to the substrate for any of the devices, then it is possible that the entire chip will not function and will need to be discarded.

As the size of the devices and the separation between the devices decrease, more devices can be placed on a chip. The complexity of manufacturing the chip increases with a decrease in size and separation, however, and the tolerances for errors in processing dramatically decrease. To manufacture the layers of film without errors or defects, it is essential that the semiconductor wafer be flat or "planar." Failure of the wafer to achieve flatness at any layer of material can cause errors at subsequently deposited levels.

The unit process operation used to ensure that the wafer is planar is chemical mechanical planarization. The chemical mechanical planarization process involves holding the semiconductor wafer against a rotating polishing pad surface at a controlled pressure. A polishing slurry that has an abrasive particle (such as alumina, silica, ceria, or zirconia) and has chemical etchants is flowed onto the pad to aid in the removal of material. Because of the rotating nature of the process and manner in which the wafer is pressed against the polishing pad, the material on the wafer that is furthest from the substrate is polished at the fastest rate while the material that is recessed is not polished at all. Thus, areas of the wafer surface that are protruding off the substrate the most are polished back to the recessed areas resulting in a finished, "planarized," flat surface.

One of the ways in which chemical mechanical planarization is used is in metallization, or formation of the network of conducting wires that create the circuit. In this step, the objective is to create a pattern of wires of tungsten, aluminum, or copper that are separated by dielectric all within the same level of the chip. The method that is used, which is often referred to as damascene metallization, starts by uniformly depositing a conformal film of the dielectric, which is generally silicon dioxide ($SiO_2$), phosphosilicate glass (PSG), or borophosphosilicate glass (BPSG). The dielectric film is then patterned such that both trenches and holes are etched into the dielectric. Next, a thin layer (usually 10 to 100 nanometers (nm) thick) of liner material, such as titanium (Ti) and titanium nitride (TiN) or tantalum (Ta) and tantalum nitride (TaN), is deposited by physical vapor deposition (PVD), otherwise known as sputter deposition, or chemical vapor deposition (CVD). Finally, approximately 600 to 1,000 nm of the conductor, which is generally tungsten (W), copper (Cu), or aluminum (Al), is deposited so that the remainder of the trenches and holes are filled.

To isolate the individual conductor-filled trenches and holes from each other electrically, it is necessary to remove the excess conductor that is not in the trenches or holes. Although it is possible in principle to remove this metal by a chemical etch or a plasma reactive ion etch process, these processes are unacceptable because they tend to remove the conductor at nearly the same rate at the top of the trenches as in the trenches. Because it planarizes as it removes material, however, chemical mechanical planarization is exceedingly efficient at removing the excess metal.

The typical scheme to isolate the conducting wires is to use a primary polishing slurry, to polish off both the excess conductor and liner material. The polishing slurry, pad, and operating parameters of the chemical mechanical planarization process are specifically optimized for a high chip yield, at high removal rate of both the conductor and liner. The metal polishing slurry usually consists of alumina particles, from 100 to 500 nm in diameter, in an acidic ($1<pH<4$) environment, with between 0.1 and 0.6M concentration of oxidizer such-as hydrogen peroxide, ferric nitrate, or potassium iodate. The role of each ingredient has a special function. The oxidizer is added to chemically attack the metal and to enhance the polishing rate. Alumina, which is considerably harder than other abrasives such as silica, ceria, or zirconia, is usually used for a high rate of polishing of the metal and slow rate of polishing of oxide. Finally, the pH is acidic to prevent polishing of the silicon oxide.

There are a number of problems that can occur during the chemical mechanical planarization process which can adversely affect the chip yield. One of the biggest problems is erosion of the dielectric, which is caused by the variation of the pattern densities of conductors across the wafer. In large regions where there is a high concentration of the metal, there is often not enough dielectric to define a polishing plane. As a result, the polishing pad tends to flex and polish the dielectric that is in the region, resulting in a large area of the wafer that is substantially lower than other places on the chip. This non-planarity tends to replicate to the next level of the chip, where it can be filled with metal or cause alignment issues.

Another problem is that the primary slurry described above can cause scratches in the dielectric, which will replicate to further levels. Although scratches are somewhat inevitable in a polishing process,. the severity of these scratches are increasing with the use of lower dielectric constant materials such as organic-based or aero-gel-based dielectrics. To eliminate the effects of severe scratches, the primary polish is usually followed by a second "touch-up" chemical mechanical planarization step that removes between 10 and 100 nm of the dielectric. This step is often accomplished with a silica-based, alkaline slurry that is formulated for a high oxide removal rate. The application of this second planarizing step is not without its own problems. This step often causes erosion of oxide in regions of high pattern density, which is the creation of more topography. In addition, because the touch-up slurry is alkaline, while the primary slurry is acidic, precipitates can form on the wafer when these two slurries contact, creating a problem in cleaning the surface.

Another problem that often occurs during chemical mechanical planarization is residual metal after polishing. Often the residual metal results from topography that exists on the wafer before the deposition of the liner materials. These regions of non-planarity might be caused by erosion or scratches at a previous level, which then replicate up through the deposition of the oxide and are then filled with the metal. Because these defects represent metal that is below the plane to which one is trying to polish, they are virtually impossible to remove via chemical mechanical planarization. That is, chemical mechanical planarization is very poor at removing material that is recessed into the dielectric. As a result, these metal-filled scratches and regions of erosion represent regions of unremoved, excess metal that tends to result in short circuits.

There have been a number of approaches that have been taken to alleviate some of these problems with the chemical mechanical planarization process. U.S. Pat. No. 5,676,587 issued to Landers et al. represents one attempt to improve upon the conventional, two-step process. The disclosed process comprises a two-step Chemical Mechanical Polishing or CMP process for removing a W or Cu layer and an underlying Ti/TiN or Ta/TaN liner, from the surface of an oxide layer, without damaging the oxide layer. In the first step of the process, an alumina-based slurry is used in a conventional CMP process to remove the W or Cu as well as an upper portion of the liner film. The first step is terminated while a substantial portion of the liner fill remains on the oxide layer. The second step uses a neutral-pH, silica-based slurry which is selective to Ti/TiN and Ta/TaN to remove the remainder of the liner film. By stopping the first step well before the polishing platen of the CMP apparatus has reached the oxide layer, the relatively abrasive alumina-based slurry is prevented from damaging the surface of the oxide layer, while the second step selectively removes the liner film.

Like the Landers et al. process, U.S. Pat. No. 5,244,534 issued to Yu et al. also discloses a two-step CMP process. The first CMP step uses a slurry containing abrasive particles, such as $Al_2O_3$, and etchants selective to W, such as $H_2O_2$ and either KOH or $HN_4OH$ or other acids and bases. The first CMP step removes the W while removing little of the oxide layer. During the last phase of the first step, which completely removes barriers such as Ti or TiN over the surface of the wafer, a portion of the W below the level of the oxide surface is also removed. Thus, a recessed W plug remains in the oxide layer. This recessed plug is both typical of conventional plug formation and difficult to couple with a subsequent layer of metal or other material.

Therefore, a second CMP step is applied. The second CMP step uses a slurry containing abrasive particles, such as $Al_2O_3$, and etchants selective to the oxide material of the dielectric layer, such as a basic mixture of $H_2O$ and KOH. The second step removes a portion of the oxide layer to a level even with, or slightly below, the level of the W plug.

CMP has some inherent problems that are exacerbated when building extremely small semiconductor structures. As structural dimensions continue to shrink, the size of defects that can be tolerated shrinks as well. Traditionally, semiconductor manufacturers were bothered by conductive residuals shorting damascene features. Such shorts become evident as yield loss or reliability problems. At ever-decreasing structural dimensions, the effect of these residuals has become a major yield problem. Some of the problems inherent in CMP are discussed below; they result in unacceptable yield loss and reliability problems.

First, scratches are inherent to the CMP process because it uses an abrasive slurry. The softer the dielectric, the harder it is to control detrimental scratches. Prospective low-dielectric materials such as aerogels and organic-based materials can be very soft; therefore, the problem will be more pronounced in the future. These scratches can fill with liner or metal material and create shorts in the final structures. As structures get smaller and smaller, this risk becomes more and more of a problem: the distance to cause a short becomes shorter and shorter.

Another problem inherent in CMP processes is that metal material from the via or metal line tends to smear to the next via or metal line. The metal contact causes a short. This problem also becomes worse as structures get smaller and smaller. Photo-etch interaction defects, which cause serration or fluting of the edge of the via or metal line, add to this problem.

The slurries used with CMP processes present still another problem. It is hard to find slurries that polish metals and oxides at the same rateconsequently, CMP creates topography variations. These topography variations are replicated to higher levels of the device structure, where they cause the same problems. The need to provide a substantially planar surface after polishing is critical.

U.S. Pat. No. 5,173,439 issued to Dash et al. combines two CMP process steps with an intermediate reactive ion etching (RIE) step. Because the final polish or etch step is CMP, however, Dash et al. encounter the same problems outlined above for all chemical mechanical planarization processing. Specifically, Dash et al. focus on a process for forming wide, dielectric- or conductor-filled isolation trenches in semiconductor substrates. An etch stop (e.g., silicon nitride) is deposited on the substrate. A layer of dielectric or conductor material (e.g., silicon dioxide) is conformally deposited on the etch stop and in the trench. Then a layer of etch-resistant material (e.g., polysilicon) is deposited.

A first CMP process removes all of the etch-resistant material except that above the wide trench, such that the remaining portions of the etch-resistant material reside within the width of the trench. This first CMP process neither removes the layer of dielectric (or conductor) material nor enters the etch stop. A plug of dielectric (or conductor) material is formed above the trench by RIE of the layer of dielectric (or conductor) material, which is not covered by the etch-resistant material, down to the top of the trench. The RIE reacts with the dielectric (or conductor) material, but not with the etch-resistant material, and is terminated by the etch stop. Finally, a second CMP process removes the plug to obtain a dielectric- or conductor-filled trench having an upper surface in substantial planarity with the upper surface of the substrate.

Dash et al. recognize other conventional techniques used to form planarized wide trenches. Many of these techniques teach masking which, although somewhat effective, has certain drawbacks. Masking techniques require extra masking and photolithographic steps, adding two processing steps and creating problems of alignment. The mask must be perfectly aligned to deposit the photoresist exactly.

The deficiencies of the conventional planarization processes show that a need still exists for an improved process of removing the tungsten or copper layer and a Ti/TiN or Ta/TaN liner film from the surface of an oxide layer. To overcome the shortcomings of the conventional processes, a new planarization process is provided. An object of the present invention is to provide a process for removing a metallization layer and an underlying liner, from the surface of a dielectric layer, without damaging the dielectric layer.

Another object of the present invention is to provide an improved process for planarizing conductor-filled trenches in the surface of a semiconductor substrate. It is another object to provide a self-aligned planarization process. It is yet another object of the present invention to provide a process that does not require expensive and time-consuming photolithographic techniques to planarize a conductor-filled trench. It is a further object to provide a process using etch steps that reduce the process sensitivity to endpoint control and increase process windows. A related object is to provide an improved process of etching back tungsten or copper layers on semiconductor wafers to allow for good contact with layers of metal or other conductive material which are subsequently deposited.

SUMMARY OF THE INVENTION

To achieve these and other objects, and in view of its purposes, the present invention provides a process of planarizing the surface of a semiconductor substrate. The process begins by forming patterned raised and recessed regions on the surface of the semiconductor substrate. A layer of material then is formed over the patterned raised and recessed regions. The layer is subject to a CMP step until all of the raised regions are at least partially removed from the layer. Finally, the surface of the polished substrate is etched with an RIE process.

Although the prior art describes numerous methods of improving the current metal chemical mechanical planarization process, these methods tend to focus on achieving good planarity with a minimal number of scratches or defects. In contrast, the process of the present invention uses a specially formulated CMP and RIE process that incorporates the best properties of a CMP process and the best properties of an RIE process to achieve better results than either of these processes separately. Specifically, CMP is used to planarize the film without concern for residual conductor or liner on the wafer. Then, in the second step, the "line of sight" etching of RIE is used to remove the residual metal and liner uniformly across the wafer.

The benefits of this combined process are multifold. The abrasive CMP slurry never contacts the dielectric and, hence, does not cause scratches or erosion of the dielectric. The RIE process is insensitive to topography and, hence, can remove the metal from prior level scratches and regions of erosion. The chemistry and operating parameters of the RIE can be adjusted to optimize the ratio of removal of oxide and metal to control whether the conductors are sticking "up" or "down." The technology can be extended to soft, low-k dielectrics rather easily.

Three, specific embodiments are disclosed for the present invention. Each focuses on polishing the stack materials conductor, the liner material, and the dielectric in a damascene metallization scheme. In the first embodiment, CMP is performed on the stack until the stack is planar, but the process is stopped before exposure of any of the liner material. RIE is applied to remove excess conductor and liner material.

In the second embodiment, CMP is performed with a process and slurry that is selective to the liner, such that the CMP process is stopped after removing all of the excess conductor but before removing all of the excess liner. RIE is applied to remove excess liner material. Finally, in the third embodiment, a traditional CMP process is performed in which both excess conductor and liner are removed, exposing the dielectric. A touch-up CMP process is performed to remove scratches, as necessary. Then RIE is applied to remove metal that is in eroded regions of prior level scratches.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF THE INVENTION

Deposited conductors are an integral part of every integrated circuit, and provide the role of surface wiring for conducting current. Specifically, the deposited conductors are used to wire together the various components that are formed in the surface of the wafer. Electronic, devices formed within the wafer have active areas which must be contacted with conductive runners, such as metal. Typically, a layer of insulating material is applied on the top of the wafer and selectively masked to provide contact opening patterns. The layer is subsequently etched, for instance with RIE, to provide contact openings from the upper surface of the insulating layer down into the wafer to provide electrical contact with selected active areas.

A metal or metal alloy is then deposited over the entire surface by PVD, CVD, plasma-enhanced chemical vapor deposition (PECVD), or vacuum evaporation.

Figure 1A:
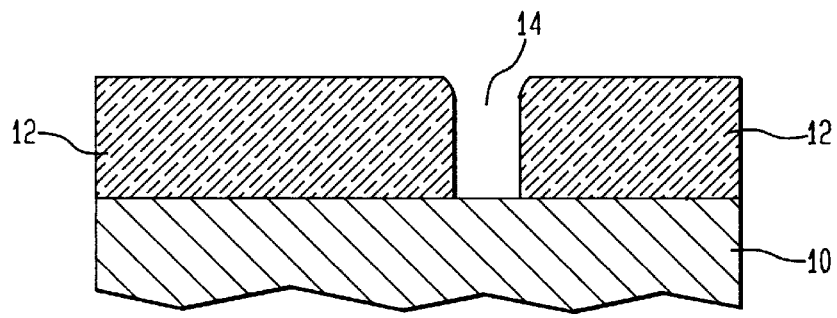
FIG. 1A is a schematic cross-sectional view of a semiconductor substrate and a dielectric oxide layer having a trench etched in the oxide layer.
Figure 1B:
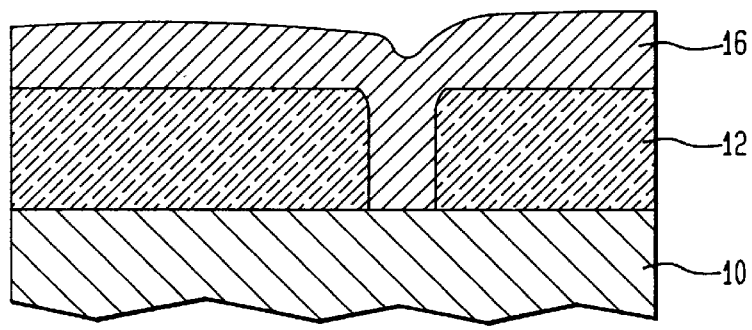
FIG. 1B is a view similar to that of FIG. 1A after a metallization layer has been deposited over the dielectric oxide layer and in the trench.

Referring now to the drawing, wherein like reference numerals refer to like elements throughout, FIGS. 1A, 1B, 1C, and 1D illustrate a CMP process and highlight one problem (topography variations) inherent in such a process. Shown in FIG. 1A is a semiconductor wafer substrate 10, typically silicon, silicon-germainium or gallium arsenide, which has previously undergone several conventional steps in the fabrication process. In particular, semiconductor substrate or wafer 10 has been overlaid with an insulative oxide layer 12. A contact hole or trench 14 has been formed in oxide layer 12. A metallization layer 16 composed of a conductor such as W or Cu was then deposited in a thickness sufficient to completely fill trench 14 (see FIG. 1B).

Figure 1C:
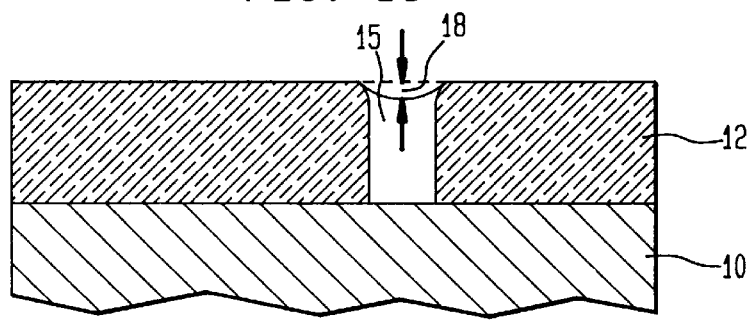
FIG. 1C is a view similar to that of FIG. 1B after a CMP process step has been applied, leaving the metallization plug recessed or dished with a planarity delta.

A CMP process is applied to remove the metallization layer 16 overlying the surface of the wafer substrate 10, except from trench 14, which leaves trench 14 filled with a metallization plug 15. During the CMP, however, the metallization layer 16 tends to polish at a different rate than the oxide layer 12 around it. The chemical nature of the slurry and compressible nature of the polishing pad cause a certain amount of the metallization layer 16 to be removed from trench 14, leaving the metallization plug 15 recessed or dished as shown in FIG. 1C. A "planarity delta" 18 is formed. Alternatively, the oxide layer 12 may be recessed or dished. In either case, the CMP process leaves topography variations.

Figure 1D:
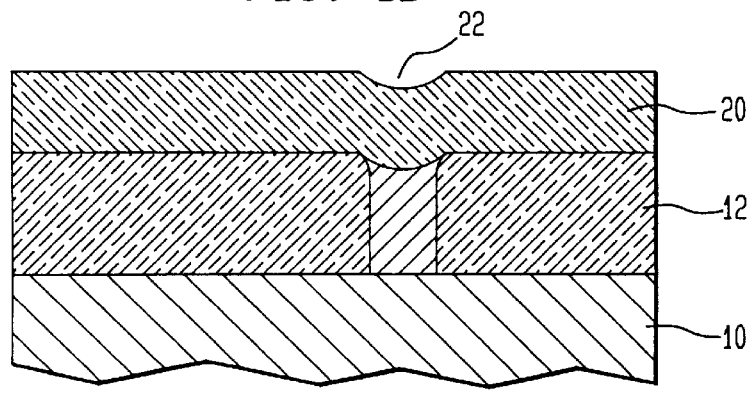
FIG. 1D is a view similar to that of FIG. 1C illustrating that the planarity delta is detrimental to subsequent levels of processing and, specifically, that a subsequent dielectric layer has a non-planar region corresponding to the planarity delta.

Planarity delta 18 is detrimental to subsequent levels of processing. The structural blemish has repercussions in the subsequent levels. For example, as shown in FIG. 1D, a dielectric layer 20 may be deposited after the CMP process. Dielectric layer 20 has a non-planar region 22 corresponding to planarity delta 18. The recessed metallization plug 15 also risks poor contact with the Al or Al alloy layer (not shown) which would be subsequently deposited by sputtering. It is difficult to provide reliable contacts between the Al and the recessed plug 15 which results from CMP processing.

Figure 2:
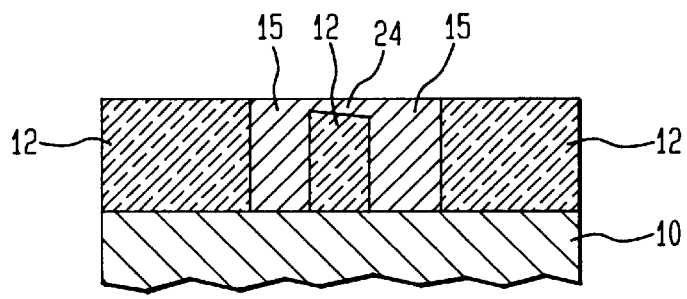
FIG. 2 illustrates one of several problems inherent in CMP processes, namely, a scratch filled by metal which creates a bridge between adjacent metallization plugs and causes a short.
Figure 3:
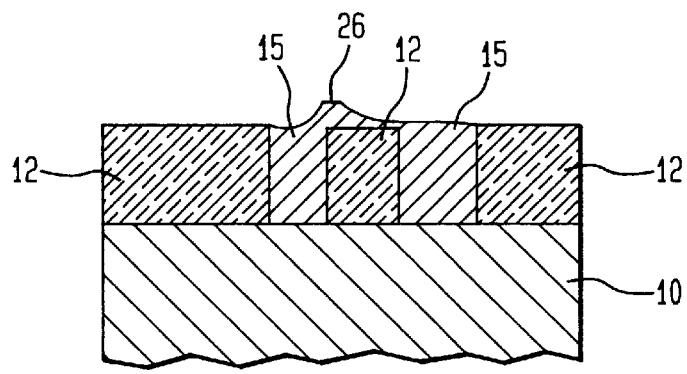
FIG. 3 illustrates another of the several problems inherent in CMP processes, namely, a smear of metal which creates a bridge between adjacent metallization plugs and causes a short.
Figure 4:
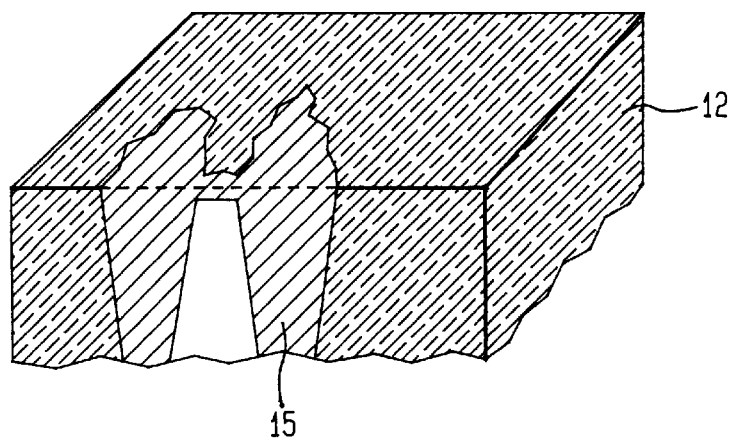
FIG. 4 illustrates a third of the several problems inherent in CMP processes, namely, a fluting-induced short.

FIGS. 2, 3, and 4 illustrate several other problems inherent in CMP processes. A scratch 24 is shown in FIG. 2. Metal fills scratch 24, creating a bridge between adjacent metallization plugs 15. The resulting structure is a short. A metallization smear 26 is shown in FIG. 3. The CMP process has taken some of the metal from one metallization plug 15 and smeared that material over the top of separating oxide layer 12, thereby forming a bridge to an adjacent metallization plug 15. Again, the resulting structure is a short. Finally, FIG. 4 illustrates a fluting-induced short. The CMP process has caused "fluting," or roughening of the side walls, of trenches 14. Such fluting has caused the side walls of adjacent metallization plugs 15 to contact.

It has become apparent that, because CMP processes have the inherent problems outlined above, the detrimental structural results obtained using a CMP process exist regardless of the number of CMP process steps applied to a given structure. Accordingly, the process of the present invention avoids the multiple CMP process steps of the conventional attempts to eliminate the detrimental structural results. The present invention combines a first CMP step with a second RIE step. Although the second step of the process of the present invention could be any non-mechanical etching process that avoids the problems inherent in CMP processes, such as a wet chemical etch or a chemical downstream etch (CDE), the advantages achieved using RIE as the second step render RIE preferred.

Figure 5A:
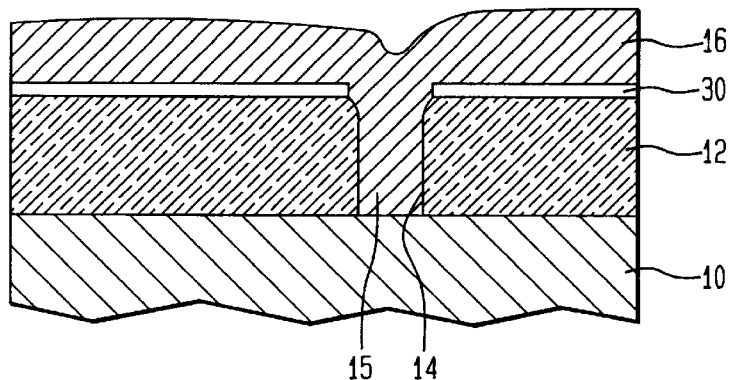
FIG. 5A is a schematic cross-sectional view of a semiconductor substrate, a dielectric oxide layer having a trench etched in the oxide layer, a polish stop on top of the oxide layer, and a metallization layer deposited over the oxide layer and in the trench.

As shown in FIG. 5A, the subject invention is proactive on a semiconductor wafer substrate 10 which has previously undergone several conventional steps in the fabrication process. In particular, semiconductor substrate or wafer 10 has been overlaid with an oxide layer 12. Oxide layer 12 may be a soft dielectric layer such as PSG or BPSG, an aerogel (defined as a material with microbeads of air and expected for future low-dielectric applications in the back-end-of-line or BEOL), or other material such as $SiO_2$. Typically, oxide layer 12 is approximately 2–3 $\mu$m thick.

A polish stop 30 is applied to the top surface of oxide layer 12. Polish stop 30 can be a hard layer or liner such as Ti/TiN, TaN/Ta, silicon nitride, or silicon carbide. Hard polish stop 30 limits the scratching damage to the composite structure. A contact hole or trench 14 is formed in oxide layer 12 and through polish stop 30. Then a metallization layer 16 such as W or Cu is deposited over polish stop 30 in a thickness sufficient to completely fill trench 14 with a plug 15. Metallization layer 16 is preferably deposited by CVD to most efficiently fill trench 14, but other workable methods known in the art are also possible. Metallization layer 16 typically forms a film over the surface of oxide layer 12 approximately 10 k Å thick. Other thicknesses are possible, however, because the film is removed in subsequent processing steps. If Cu is deposited, a PVD copper seed layer may be deposited over polish stop 30 before metallization layer 16 is applied.

The steps of applying the polish stop 30 and forming the trench 14 can be reversed. Thus, trench formation can be followed by deposition of polish stop 30. The result would be the same structure as illustrated in FIG. 5A, except that polish stop 30 would extend along the side walls and bottom of trench 14.

Next, a CMP process is applied to remove the metallization layer 16 (W or Cu) overlying the surface of the wafer substrate 10, except from trench 14, which leaves trench 14 filled with a metallization plug 15. In a preferred embodiment of the present invention, the CMP process stops in polish stop 30. Alternatively, the CMP process may be permitted to remove the polish stop or liner completely. In a third embodiment of the present invention, the CMP process stops before reaching polish stop 30.

The CMP process involves holding the structure of FIG. 5A in a rotating head or wafer carrier. Metallization layer 16 is held against a rotating polishing platen or table under a controlled pressure. The polishing platen is typically covered with a relatively soft, wetted, pad material such as blown polyurethane or other polymers. The pad material of the platen is wetted with a polishing slurry. The slurry is a mixture of a chemical component and an abrasive component. The chemical component may include reagents such as $H_2O_2$, $KIO_3$, $Fe_3(NO_3)_3$ and either KOH or $NH_4OH$, $H_2NO_3$ or other acids or bases. The abrasive component may include small alumina ($Al_2O_3$), ceria particles, or other abrasive.

A relatively soft abrasive slurry with ceria (or cerium oxide, $CeO_2$) as the abrasive and ferric nitrate oxidizer is preferred. The slurry removes a W metallization layer at a predictable rate. Another suitable structural item used to implement the CMP process step is a soft polish pad such as a Politex or GS pad available from Rodel, Inc. Suitable parameters for implementation of the CMP process step include a downward force applied to the pad of about 3–5 psi, about 2 psi of back pressure, a carrier speed of about 50 rpms, a table speed of about 50 rpms, and a polish time of 30–90 seconds.

Figure 5B:
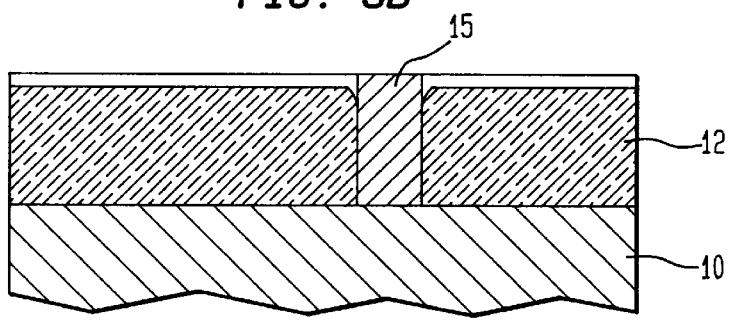
FIG. 5B is a view similar to that of FIG. 5A after completion of a first embodiment of the first step of the subject invention, namely, a CMP process that removes the metallization layer except from the trench, thus leaving the trench filled with a metallization plug, and that stops in the polish stop.

The CMP process removes metallization layer 16 as well as an upper portion of polish stop 30. The result is shown in FIG. 5B. This first step in the two-step process of the present invention is stopped in polish stop 30 while a substantial portion of polish stop 30 remains on oxide layer 12. Such stopping can be accomplished by setting the polish time based on the estimated thickness of metallization layer 16 or by using a commonly available endpoint monitoring system. The stopping point of this step may occur at any point within the thickness of polish stop 30 to simplify process control and minimize the complexity and expense of implementing the subject invention: a relatively large process window is available in which to stop the first step.

A conventional end point monitoring system, such as Model #2350 Planarization Endpoint Controller manufactured by Luxtron Corporation of Santa Clara, Calif., may be used in combination with the subject invention. By measuring the amount of electric current drawn by the drive motor of the CMP polisher, such a system can indicate when the platen has removed substantially all of metallization layer 16 and has moved into surface-to-surface contact with polish stop 30. Accordingly, use of such an end point monitoring system may further enhance control of the process of the subject invention to still further improve the chip yield achieved using the subject invention.

By stopping the first step well before the polishing platen of the CMP apparatus has reached oxide layer 12, the relatively abrasive slurry is prevented from damaging the surface of oxide layer 12. CMP particles never touch the surface of oxide layer 12 using the process of the subject invention. This both minimizes scratches in the oxide surface and reduces topography variations that normally occur from density effects as metal features are polished in the oxide. The polish stop 30 contains all of the defects associated with the slurry processing of the CMP first step.

The second step of the process of the subject invention, a selective RIE step, removes the remainder of the polish stop 30—and the defects contained in polish stop 30. Thus, the CMP process step is followed by an RIE process step that removes polish stop 30 leaving oxide layer 12 as a defect-free dielectric surface. One result of the RIE step may be the structure shown in FIG. 5C. The common surface 32 of plug 15 and of oxide layer 12 is substantially planar.

Thus, the present invention incorporates an RIE step in conjunction with a prior CMP step to (1) remove residuals, metal and other debris left by the CMP step, and (2) create a more planar surface that leads to fewer defects at higher levels of subsequent processing. FIG. 5D shows the structure of FIG. 5C after a subsequent level of dielectric material 34 has been applied. The substantially planar surface 32 of plug 15 and of relatively soft oxide layer 12 (FIG. 5C) permit the surface 36 of dielectric material 34 to be substantially planar. Topographic variation is virtually eliminated.

Figure 5C:
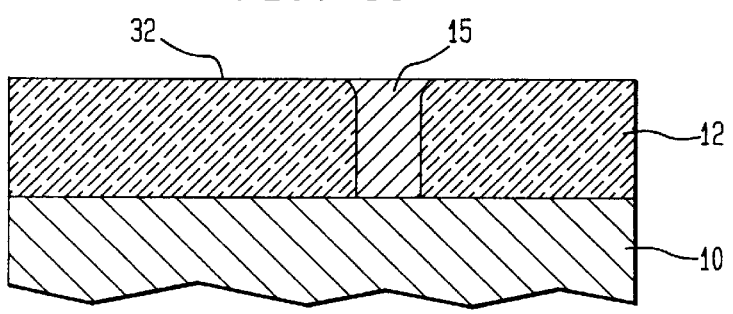
FIG. 5C is a view similar to-that of FIG. 5B after completion of a first embodiment of the second step of the subject invention, namely, an RIE process step that removes the polish stop, leaves the oxide layer as a defect-free dielectric surface, and renders substantially planar the common surface of the plug and of the oxide layer.
Figure 5D:
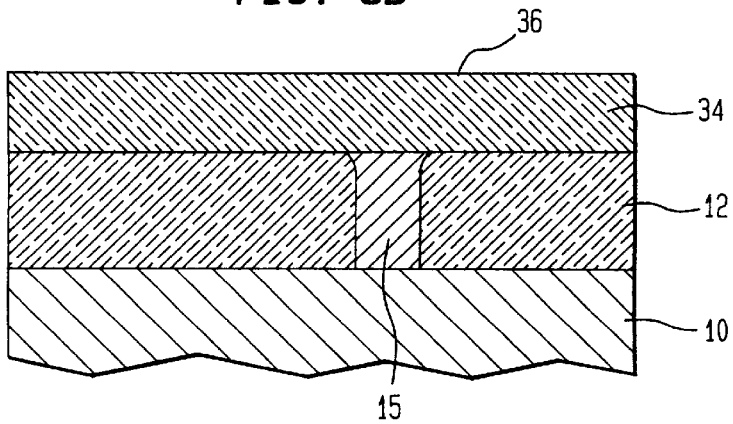
FIG. 5D is a view similar to that of FIG. 5C after a subsequent level of dielectric material has been applied.

One result of the RIE step is the structure shown in FIG. 5C. Alternatively, the selectivity of the RIE process allows the process to preferentially remove one material relative to another. The RIE process can be tailored to preferentially remove polish stop 30 relative to metallization layer 16, for example, or to preferentially remove oxide layer 12 relative to metallization layer 16. Another result of the RIE step is, therefore, the structure shown in FIG. 6.

Figure 6:
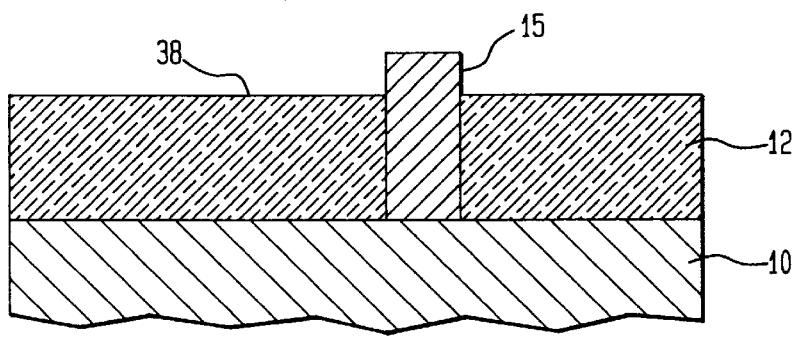
FIG. 6 is a view similar to that of FIG. 5B after completion of a second embodiment of the second step of the subject invention, namely, an anisotropic RIE step that produces a protruding plug of metallization material.

In the embodiment of the present invention illustrated in FIG. 6, the RIE step follows the CMP step of FIG. 5B. The RIE step preferentially removes polish stop 30 relative to metallization layer 16. The RIE step may also be continued to remove additional oxide layer 12. In either case, the RIE step produces a protruding plug 15 of metallization material as shown in FIG. 6. The RIE step can be tailored to pre-determine the amount of protrusion for plug 15 as desired.

Although not a requirement of the inventive process, the RIE step may more specifically produce a convexly rounded, protruding plug 15. The rounded surface of plug 15 provides a surface which is easily coupled to a layer of Al (not shown) formed by sputtering or other mechanisms during subsequent wafer processing steps. Plugs 15 with a diameter of less than 1 micron can be produced. In addition to producing uniform plugs 15 which are not recessed within oxide layer 12, the RIE second step of the inventive two-step process yields a more planarized oxide layer surface 38.

For purposes of illustration, Table I shows faster removal of oxide layer 12 relative to removal of metallization layer 16 using the selective RIE process.

TABLE I

OXIDE VERSUS TUNGSTEN REMOVAL
Tencor High-Resolution Profilometer Measurements

| Etch (time, sec) | Oxide Removal (mm) | Tungsten Removal (mm) |
|---|---|---|
| 15 | 355 | 325 |
| 15 | 360 | 320 |
| 15 | 356 | 346 |
| 15 | 357 | 327 |
| AVG. | 357 | 330 |
| 22 | 530 | 390 |
| 22 | 535 | 385 |

TABLE I-continued

OXIDE VERSUS TUNGSTEN REMOVAL
Tencor High-Resolution Profilometer Measurements

| Etch (time, sec) | Oxide Removal (mm) | Tungsten Removal (mm) |
|---|---|---|
| 22 | 531 | 431 |
| 22 | 530 | 405 |
| 22 | 527 | 402 |
| AVG. | 530 | 403 |
| 15 | 318 | 253 |
| 15 | 341 | 286 |
| 15 | 341 | 251 |
| 15 | 351 | 271 |
| 15 | 341 | 256 |
| AVG. | 338 | 263 |
| 10 | 216 | 151 |
| 10 | 222 | 172 |
| 10 | 218 | 178 |
| 10 | 211 | 146 |
| 10 | 221 | 171 |
| AVG. | 218 | 164 |

Atomic Force Microscope Measurements

| Etch (time, sec) | Oxide Removal (mm) | Tungsten Removal (mm) |
|---|---|---|
| 15 | 355 | 255 |
| 22 | 530 | 390 |
| 15 | 318 | 248 |
| 10 | 216 | 146 |

RIE is a directed, dry, chemical etching process used in integrated circuit fabrication in which chemically active ions are accelerated along electric field lines to meet a substrate perpendicular to the substrate surface. The central part of an RIE system is a vacuum chamber containing an electrode to which rf power (commonly at 13.56 MHz) is capacitively fed using an automatic matching network. The substrate to be etched is placed on the rf-driven electrode. Reactive gases are admitted from a gas manifold using mass flow controllers. Different gases are used to etch different substrates. A typical RIE process is conducted in the pressure range of 10–200 mtorr. The process chamber is evacuated to this pressure range using pumps capable of handling the high flow rates of reactive gases.

Reactive species are produced in the following fashion. A large rf voltage (up to about 1 kV) is applied between the substrate electrode and the counter electrode. The counter electrode is often placed in the wall of the chamber. The gas breaks down and a discharge is established. The gas discharge contains atoms, radicals, positive and negative ions, electrons, and neutral species. Chemical reactions between the discharge-generated atoms and radicals and the material to be etched occur at the surface, producing volatile species which desorb into the gas phase and are pumped out of the chamber.

Plasma etching itself, without ion bombardment, results in isotropic etching characteristics (i.e., substantially constant etching characteristics regardless of direction). In RIE, etching directionality (anisotropy) is achieved by energetic ion bombardment: the substrate is bombarded with positive ions. Ion bombardment enhances or initiates one or all of the fundamental reaction steps occurring at the surface of the substrate and leads to different etching rates depending upon direction. Ion bombardment occurs because the discharge causes the substrate electrode to acquire a negative charge, which repels electrons and accelerates positive ions.

Provided below in Table II is an example metal RIE process recipe suitable for use as the second step of the two-step process of the present invention. The system temperature was approximately 70° C. The temperatures of the top and bottom electrodes were about 70° C. and 50° C., respectively.

TABLE II

METAL RIE PROCESS RECIPE

| Step: | (1) | (2) | (3) | (4) | (5) | (6) | (7) | (8) |
|---|---|---|---|---|---|---|---|---|
| A. Main Chamber (M/C) | | | | | | | | |
| Press (mtorr) | 0 | 12 | 12 | 12 | 12 | 0 | 0 | 0 |
| RF Top | 0 | 0 | 500 | 500 | 500 | 0 | 0 | 0 |
| RF Bottom | 0 | 0 | 250 | 400 | 250 | 0 | 0 | 0 |
| Gap (cm) | N/A | N/A | N/A | N/A | N/A | N/A | N/A | N/A |
| C12 | 0 | 30 | 30 | 70 | 30 | 0 | 0 | 0 |
| BC13 (ccm) | 0 | 60 | 60 | 70 | 60 | 0 | 0 | 0 |
| SF6 | 0 | 0 | 0 | 0 | 0 | 0 | 0 | 0 |
| CH4 | 0 | 0 | 0 | 0 | 0 | 0 | 0 | 0 |
| N2 | 0 | 0 | 0 | 0 | 0 | 0 | 0 | 0 |
| N2 | 0 | 0 | 0 | 0 | 0 | 0 | 0 | 0 |
| He clamp (torr) | 8 | 8 | 8 | 8 | 8 | 8 | 0 | 0 |
| Completion | Stabl | Stabl | Time | End | Slope <= | Time | Time | |
| Time (sec) | 15 | 30 | 15 | 70 | 60 | 15 | 15 | 0 |
| B. Decoupled Source Quartz (DSQ) Chamber - Paddle Temp @ 230° C. | | | | | | | | |
| Paddle pos. | Down | Up | Up | Up | Up | Up | Up | Up |
| Press (mtorr) | 1000 | 1000 | 1000 | 1000 | 1000 | 1000 | 1000 | |
| RF | 0 | 0 | 1000 | 0 | 1000 | 0 | 1000 | |
| 02 | 0 | 0 | 0 | 1000 | 1000 | 0 | 0 | |
| 02 | 30 | 30 | 30 | 0 | 0 | 0 | 0 | |
| H2O Vapor | 300 | 300 | 300 | 0 | 0 | 300 | 300 | |
| Completion | End | Time | Time | Stabl | Time | Stabl | Time | End |
| Time (sec) | 15 | 10 | 60 | 15 | 60 | 15 | 30 | |
| C. Atmospheric Process Camber (APM) | | | | | | | | |
| Cold H2O | Off | On | On | on | Off | off | | |
| Hot H2O | Off | On | Off | off | Off | off | | |
| Cold N2 | Off | Off | Off | off | Off | on | | |
| Hot N2 | Off | Off | Off | off | Off | off | | |
| Spin (rpm) | 300 | 300 | 300 | 500 | 2000 | 0 | | |
| Time (sec) | 5 | 20 | 50 | 25 | 30 | 30 | | |

The three sections of Table II provide data for the three chambers of the tool used for the RIE: a main chamber (M/C); a decoupled source quartz (DSQ) chamber for water vapor plasma, helping to reduce corrosion; and an atmospheric process (APM) chamber, where cleaning water is applied. In the rows labeled "Completion," each step of the RIE process was terminated upon reaching one of a number of conditions.

The step might terminate because it has stabilized ("Stabl"), completed the full time (e.g., 10, 15, 30, 60, or 70 seconds) allotted for the step ("Time"), reached an endpoint ("End"), or attained a slope matching a pre-determined condition ("Slope<=").

Figure 7A:
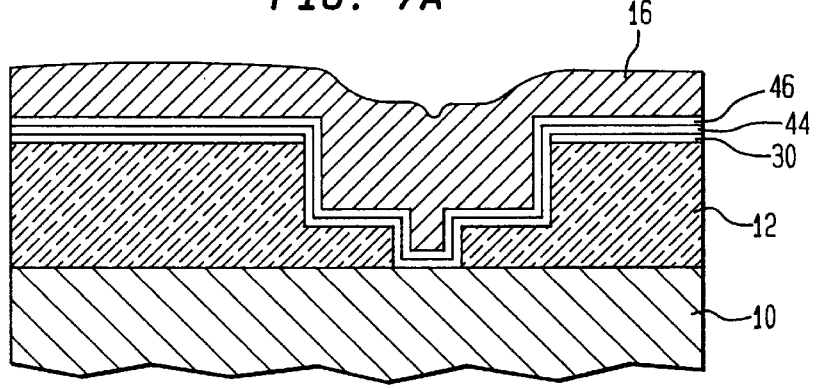
FIG. 7A is a schematic cross-sectional view of a semiconductor substrate, a dielectric oxide layer having a dual damascene metal via and line etched in the oxide layer, a polish stop on top of the oxide layer, a liner over the polish stop and within the via and line, a seed layer over the liner, and a metallization layer deposited over the seed layer.
Figure 7B:
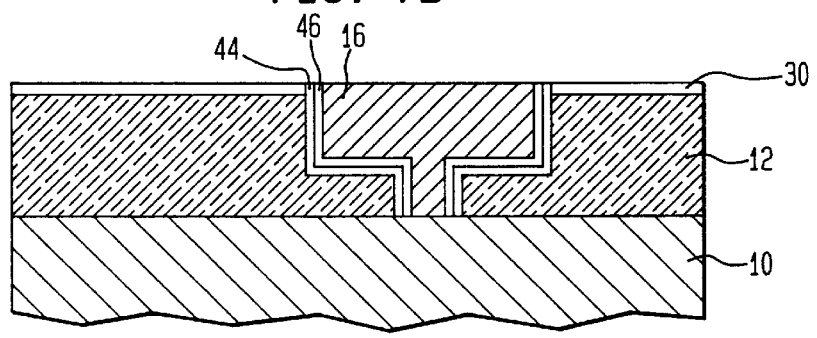
FIG. 7B is a view similar to that of FIG. 7A after completion of a first embodiment of the first step of the subject invention, namely, a CMP process that removes the metallization layer except from the via and line, thus leaving the via and line filled with metal, and that stops in the polish stop.
Figure 7C:
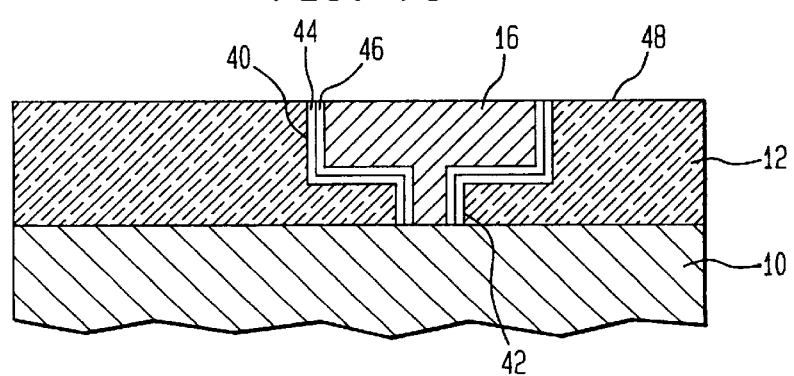
FIG. 7C is a view similar to that of FIG. 7B after completion of a first embodiment of the second step of the subject invention, namely, an RIE process step that removes the polish stop, leaves the oxide layer as a defect-free dielectric surface, and renders substantially planar the common surface of the metal-filled via and line and of the oxide layer.

FIGS. 7A, 7B, and 7C illustrate the application of the two-step process of the present invention to form a dual damascene via 40 and line 42. The damascene process has been used in the semiconductor fabrication of metal wiring lines, including the bit-lines for Dynamic Random Access Memory (DRAM) capacitors. A predefined damascene pattern, shown as a "T"-shape in the cross sections of FIGS. 7A, 7B, and 7C, is formed in the dielectric oxide layer 12.

One or more layers are then deposited on the top surface of oxide layer 12 and, optionally at least for some layers, within via 40 and line 42. As illustrated in FIG. 7A, a polish stop 30 (typically a nitride) may first be deposited. Polish stop 30 covers the top surface of oxide layer 12, in the example of FIG. 7A, but is not present within via 40 and line 42.

A CVD or similar process then is used to apply a conformal coating or film of a liner 44, such as Ti/TiN or Ta/TaN, over polish stop 30 or to the top surface of oxide layer 12 if polish stop 30 is absent. Liner 44 may be applied in a single process step. Alternatively, a first step may apply one component of liner 44 (e.g., TiN or TaN) followed by application of the other component (e.g., Ti or Ta) of liner 44 in a second step. As illustrated in FIG. 7A, liner 44 covers polish stop 30 on the top surface of oxide layer 12 and directly covers oxide layer 12 within via 40 and line 42.

Next, a PVD or similar process is used to apply a conformal coating or film of a seed layer 46, such as a copper seed layer if the metallization material will be copper, over liner 44. As illustrated in FIG. 7A, seed layer 46 covers liner 44 both over the top surface of oxide layer 12 and within via 40 and line 42. Finally, metallization layer 16 is applied. These steps result in the structure shown in FIG. 7A.

The two-step process of the present invention is then applied to the structure of FIG. 7A. The first CMP step of the process removes metallization layer 16 as well as the upper portions of seed layer 46, liner 44, and polish stop 30. The result is shown in FIG. 7B (which parallels the structure shown in FIG. 5B). The second step of the process of the subject invention, a selective RIE step, removes the remainder of the polish stop 30—and the defects contained in polish stop 30. What remains is an oxide layer 12 providing a defect-free dielectric surface. One result of the RIE step may be the structure shown in FIG. 7C (which parallels the structure shown in FIG. 5C). The common surface 48 of metallization layer 16 in via 40 and of oxide layer 12 is substantially planar.

Thus, the RIE step is used to remove conducting defects such as residual liner between metal vias and lines. The RIE can be tailored to remove varying amounts of dielectric (e.g., oxide layer 12), liner 44, and metallization layer 16. The RIE can be directed, therefore, toward specific defect types and can modify the height of the damascene features relative to the dielectric for optical alignment purposes.

The subject invention thus optimizes processing of semiconductor wafer or substrate 10 by taking advantage of the relatively high polish rate and excellent planarity provided by the CMP slurry, while ensuring that the majority of defects caused by the abrasive slurry occur in polish stop 30 rather than in oxide layer 12. The second, RIE step of the process of the subject invention is superior to CMP in that RIE does not create the problems (e.g., scratches, smears, fluting, and erosion) inherent in CMP. Moreover, the two-step process of the present invention produces a superior final product by eliminating imperfections and non-planarities introduced to oxide layer 12 by conventional processes. The subject invention has also been shown to produce semiconductors having far fewer defects than the devices produced using the conventional processes discussed above.

Figure 8A:
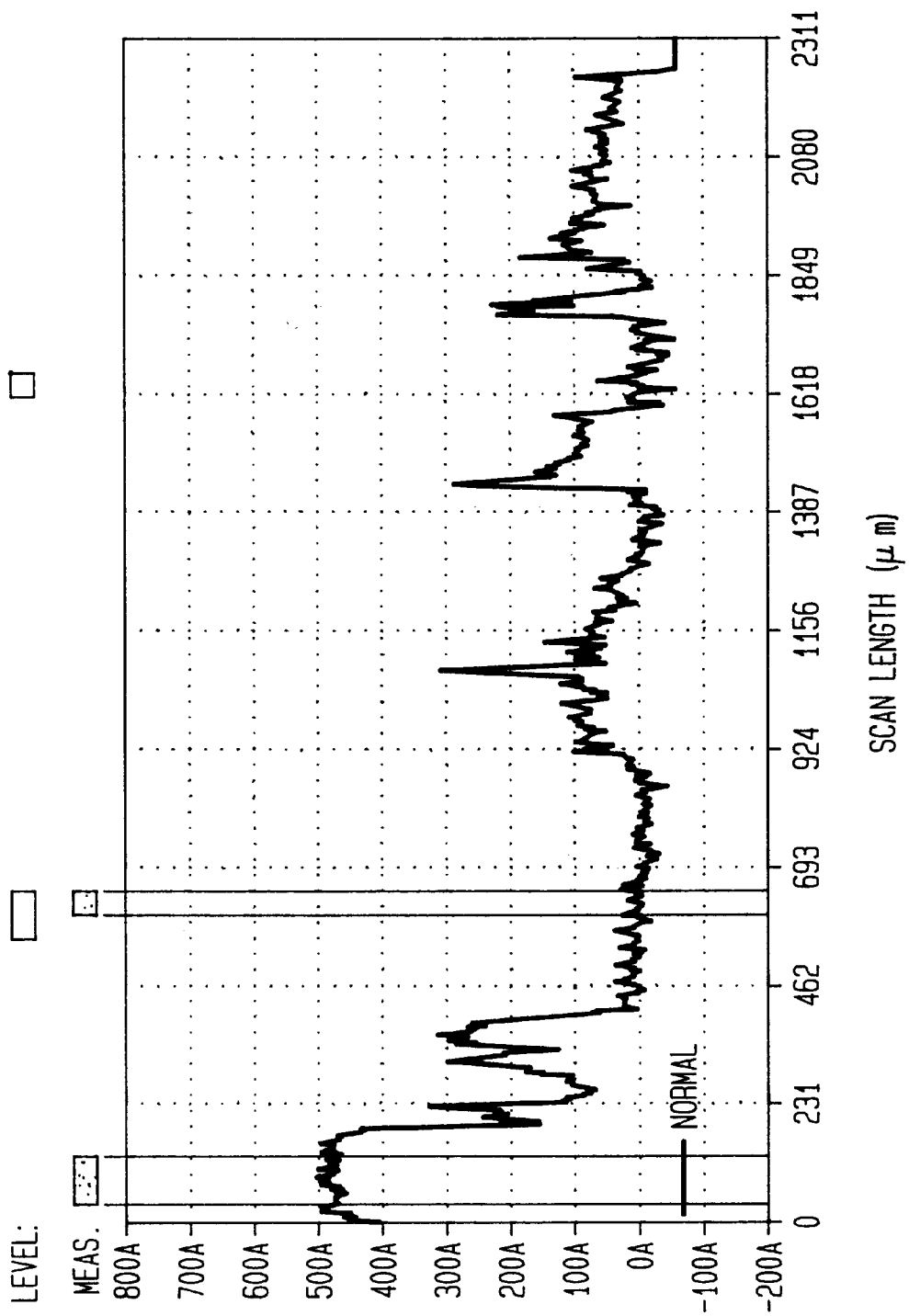
FIG. 8A is a profilometer graph of a cross section of a chip fabricated using a conventional process, illustrating the non-planarity of the chip.
Figure 8B:
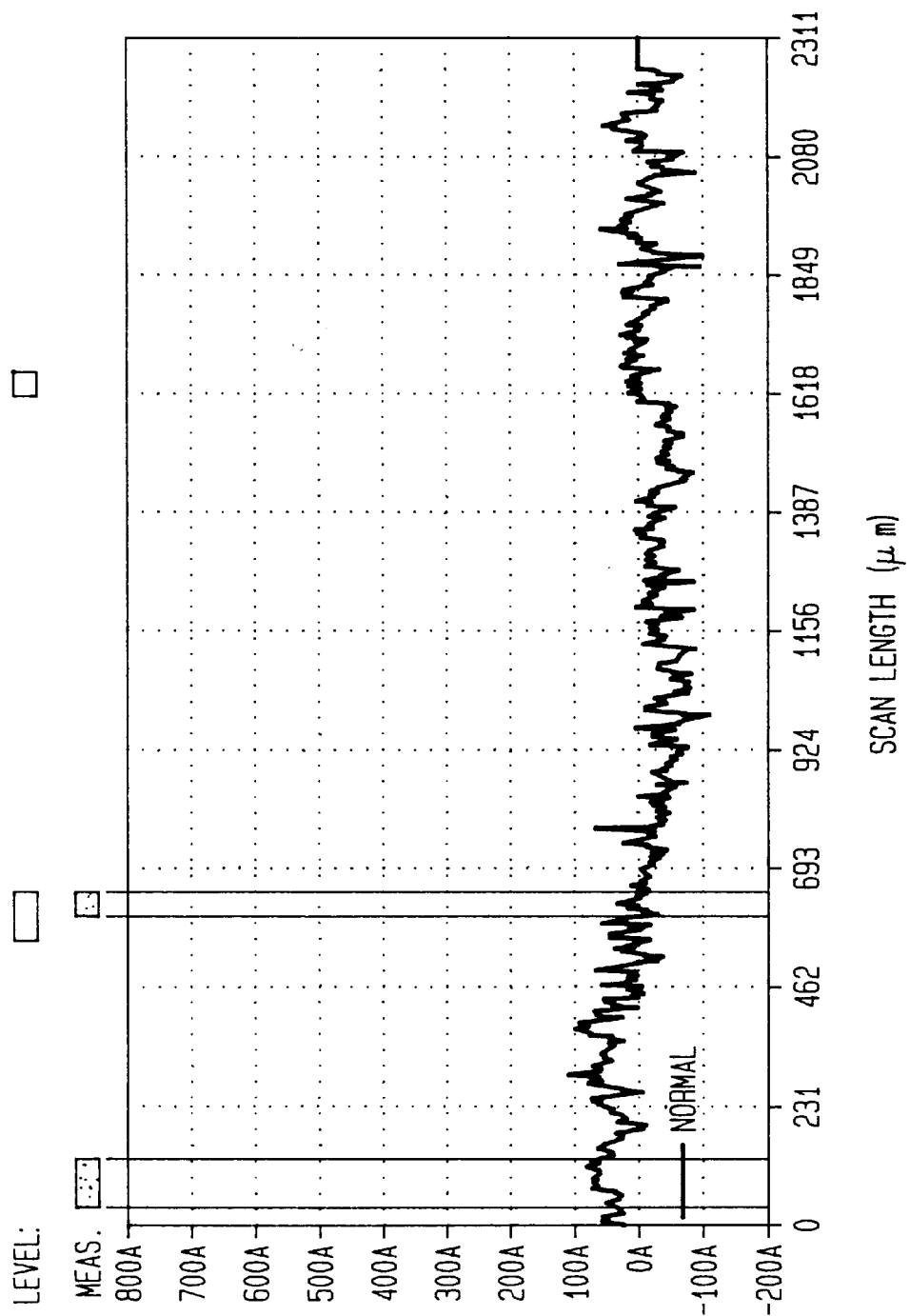
FIG. 8B is a profilometer graph of a cross section of a chip fabricated using the process of the present invention, illustrating the improved planarity of the chip.

The combined CMP-RIE process of the present invention has been used to planarize the surface of wafers in preparation for device fabrication. FIGS. 8A and 8B provide a comparison illustrating the improved planarity achieved by the process of the present invention. Each of FIG. 8A and 8B are graphs representing profilometer measurements taken through a cross section of a semiconductor wafer after processing. The graphs show low pattern factors on the left (where the cross section is through the "kerf" region just off the edge of the chip) and pattern factors on the right (in the wafer or "array" region) in the chip.

The wafer of FIG. 8A was fabricated using a conventional process. The amount of variation in the topography is relatively large. Moreover, the topography has a step of about 500 Angstroms. Although such a topographical step is large in comparison to the topography achieved using the present invention, it is the result of excellent processing: conventional processes usually result in much larger topographical non-planarity.

The wafer of FIG. 8B was fabricated using the two-step process of the present invention. Almost all of the topographical variation is noise, with a maximum (worst case) step of less than 100 Angstroms. The surface of the wafer is substantially planar. Moreover, the amount of variation in the topography of the wafer is limited to the thickness of the liner (or polish stop). This limitation permits increased control of the process of the present invention.

Table III below summarizes the results of quality control tests done during processing of wafers in preparation for device fabrication. The first section ("A") of the Table compiles data from In-Line Testing (ILT) of four sample batches of wafers during processing. The data indicate that wafers processed using the present invention achieved an average 99.3% pass rate. For comparison purposes, wafers processed using a conventional method achieved an average 93.6% pass rate. Failures were due largely to surface shorts.

The second section ("B") of Table III compiles data from Final Wafer Yield (FWY) tests of four sample batches of wafers after processing. These "final" tests were done on ship quality hardware. The data show that the process of the present invention significantly improved the acceptable yield (i.e., the number of "perfects").

Even more dramatic, as illustrations of the improvements achieved by the process of the present invention, are the data in the third section ("C") of Table III. These data represent the ratio of "perfects" to "fixables" after both the conventional and inventive processes were completed. The data show, on average, almost a three-fold improvement using the two-step process of the present invention over the conventional process.

TABLE III

COMPARISON OF YIELDS FOR CONVENTIONAL PROCESS VERSUS PROCESS OF THE PRESENT INVENTION

| Sample | Sample Id. | Conventional | Invention |
|---|---|---|---|
| A. ILT DATA | | | |
| A | 9SR290077U | 94.8% | 98.4% |
| B | 9SR290087U | 94.4% | 99.5% |
| C | 9SR290097U | 92.9% | 99.3% |
| D | 9SR290197U | 92.1% | 100% |
| AVG. | | 93.6% | 99.3% |
| B. FWY DATA | | | |
| A | 9SR290077U | 17.3% | 24.7% |
| B | 9SR290087U | 20.7% | 19.7% |
| C | 9SR290097U | 23.5% | 25.4% |
| D | 9SR290197U | 29.1% | 38.3% |
| AVG. | | 22.7% | 27.0% |
| C. RATIO OF PERFECTS TO FIXABLES | | | |
| A | 9SR290077U | 3.3 | 7.3 |

TABLE III-continued

COMPARISON OF YIELDS FOR CONVENTIONAL PROCESS
VERSUS PROCESS OF THE PRESENT INVENTION

| Sample | Sample Id. | Conventional | Invention |
|---|---|---|---|
| B | 9SR290087U | 7.6 | 13.3 |
| C | 9SR290097U | 3.5 | 8.7 |
| D | 9SR290197U | 1.6 | 16.4 |
| AVG. | | 4.0 | 11.4 |

Although illustrated and described herein with reference to certain specific embodiments, the present invention is nevertheless not intended to be limited to the details shown. Rather, various modifications may be made in the details within the scope and range of equivalents of the claims and without departing from the spirit of the invention. For example, insulators other than those comprising oxide could be used. A $Si_3N_4$ insulator might be suitable in some applications. In addition, various acids, bases, and abrasive materials can be used in the CMP slurry within the scope and spirit of the present invention.

What is claimed:

1. A process of planarizing the surface of a semiconductor substrate comprising the steps of:
    patterning raised regions on, and at least one recess in, the surface of the semiconductor substrate;
    providing a liner on at least the raised regions on the surface of the semiconductor substrate;
    forming a layer of material on the liner and over the raised regions and in the recess;
    chemical mechanical planarizing the layer until the layer is substantially removed from all of the raised regions, leaving the layer in the recess, and stopping the chemical mechanical planarizing in the liner, the liner including defects associated with the chemical mechanical planarizing; and thereafter
    reactive ion etching the surface of the polished substrate and removing the liner to complete the process.

2. The process of claim 1 wherein the reactive ion etching is selective and control as the height of the layer in the recess relative to the raised regions.

3. The process of claim 1 wherein the liner is a relatively hard material that is minimally damaged by the chemical mechanical polishing step and protects the relatively soft semiconductor substrate.

4. The process of claim 3 wherein the liner is selected from the group consisting Ti/TiN, Ta/TaN, silicon nitride, and silicon carbide.

5. The process of claim 1 wherein the material is a conductor.

6. The process of claim 5 wherein the conductor is one of tungsten, aluminum and copper.

7. The process of claim 1 wherein the layer of material is formed by one of chemical vapor deposition and plasma-enhanced chemical vapor deposition.

8. The process of claim 1 wherein the semiconductor substrate comprises a wafer overlaid with an oxide layer selected from the group consisting of phosphosilicate glass, borophosphosilicate glass, an aerogel, and silicon dioxide.

9. The process of claim 1 wherein the recess is a dual damascene via and line.

10. A process of planarizing the surface of a semiconductor substrate comprising a wafer overlaid with an oxide layer, the process comprising the steps of:
    patterning raised regions on, and at least one recess in, the surface of the oxide layer;
    providing a liner on at least the raised regions on the surface of the oxide layer;
    forming a conductive layer on the liner on the raised regions and in the recess;
    chemical mechanical polishing the layer;
    stopping the chemical mechanical polishing step in the liner, whereby the liner contains substantially all of the defects associated with the chemical mechanical processing step and the conductive layer remains in the recess; and thereafter
    reactive ion etching the surface of the polished substrate, preferentially removing the liner and leaving the surface of the semiconductor substrate substantially free of defects to complete the process.

11. The process of claim 10 wherein the reactive ion etching selectively controls the height of the conductive layer in the recess relative to the raised regions.

12. The process of claim 10 wherein the liner is selected from the group consisting of Ti/TiN, Ta/TaN, silicon nitride, and silicon carbide.

13. The process of claim 10 wherein the conductive layer is one of tungsten aluminum and copper.

14. The process of claim 10 wherein the conductive layer is formed by one of chemical vapor deposition and plasma-enhanced chemical vapor deposition.

15. The process of claim 10 wherein the oxide layer is selected from the group consisting of phosphosilicate glass, borophosphosilicate glass, an aerogel, and silicon dioxide.

16. A process of producing a conductive plug in an insulation layer having a surface, the process comprising the steps of:
    a) removing a portion of the insulation layer to form a contact hole within the insulation layer;
    b) providing a polish stop on the surface of the insulation layer;
    c) applying a layer of conductive material to the insulation layer, thereby covering the polish stop and filming the contact hole with the conductive material;
    d) chemical mechanical polishing with a slurry comprising an abrasive material and an etchant to remove substantially all of the conductive material from the surface of the insulation layer;
    e) stopping the chemical mechanical polishing step within the polish stop, thereby leaving the contact hole filled with the conductive material and forming a conductive plug; and thereafter
    f) reactive ion etching to remove the polish stop, leave the surface of the insulation layer substantially free of defects, and render substantially planar the surface of the insulation layer, the reactive ion etching step concluding the process.

17. The process of claim 16 wherein the contact hole is formed by etching.

18. The process of claim 16 wherein the conductive layer is applied by one of chemical vapor deposition and plasma-enhanced chemical vapor deposition.

19. The process of claim 16 wherein the abrasive material comprises cerium oxide.

20. The process of claim 16 wherein step f) of reactive ion etching renders substantially planar the common surface of the insulation layer and the conductive plug.

21. The process of claim 16 wherein step f) of reactive ion etching is selective and continues until the surface of the insulation layer is lower than the upper surface of the conductive plug, thereby resulting in the conductive plug protruding from the surface of the insulation layer.

22. The process of claim 16 wherein the plug formed comprises one of tungsten, aluminum and copper.

23. The process of claim 16 wherein the insulation layer comprises an oxide.

24. The process of claim 16 wherein the contact hole is a dual damascene via and line.

25. The process of claim 16 wherein the order of steps a) and b) are reversed.

26. The process of claim 16 further comprising, before the step c) of applying a layer of conductive material, providing at least one of a liner and a seed layer over the polish stop and within the contact hole.

* * * * *

UNITED STATES PATENT AND TRADEMARK OFFICE
CERTIFICATE OF CORRECTION

PATENT NO. : 6,221,775 B1  
DATED : April 24, 2001  
INVENTOR(S) : Ference et al.

Page 1 of 1

It is certified that error appears in the above-identified patent and that said Letters Patent is hereby corrected as shown below:

<u>Title page,</u>  
Item [73], Assignee, delete "International Business Machines Corp." and insert -- International Business Machines Corporation --

<u>Column 6,</u>  
Line 49, Fig. 5C, delete "to-that" and insert -- to that --.

<u>Column 12,</u>  
Line 39, delete

"Time    (sec)    15    10    60    15    60    15    30"

and insert

-- Time (sec)    15    10    60    15    60    15    30 --

<u>Column 15,</u>  
Line 41, delete "control as" and insert -- controls --.

Signed and Sealed this

Fourteenth Day of May, 2002

*Attest:*

*Attesting Officer*

JAMES E. ROGAN  
*Director of the United States Patent and Trademark Office*